United States Patent
Yang et al.

(10) Patent No.: US 7,186,319 B2
(45) Date of Patent: Mar. 6, 2007

(54) MULTI-TRACK MAGNETRON EXHIBITING MORE UNIFORM DEPOSITION AND REDUCED ROTATIONAL ASYMMETRY

(75) Inventors: Hong S. Yang, Pleasanton, CA (US); Tza-Jing Gung, San Jose, CA (US); Jian-Xin Lei, Santa Clara, CA (US); Ted Guo, Mountain View, CA (US)

(73) Assignee: Applied Materials, Inc., Santa Clara, CA (US)

( * ) Notice: Subject to any disclaimer, the term of this patent is extended or adjusted under 35 U.S.C. 154(b) by 51 days.

(21) Appl. No.: 11/029,641

(22) Filed: Jan. 5, 2005

(65) Prior Publication Data

US 2006/0144703 A1 Jul. 6, 2006

(51) Int. Cl.
*C23C 14/35* (2006.01)

(52) U.S. Cl. ............................ 204/192.12; 204/192.13; 204/298.03; 204/298.19; 204/298.2

(58) Field of Classification Search ........... 204/192.12, 204/192.13, 298.03, 298.19, 298.2, 298.21, 204/298.22
See application file for complete search history.

(56) References Cited

U.S. PATENT DOCUMENTS

| | | | | |
|---|---|---|---|---|
| 4,631,106 A | * | 12/1986 | Nakazato et al. | ...... 156/345.46 |
| 4,995,958 A | | 2/1991 | Anderson et al. | ........ 204/298.2 |
| 5,242,566 A | | 9/1993 | Parker | ...................... 204/298.2 |
| 5,314,597 A | * | 5/1994 | Harra | ..................... 204/192.13 |
| 5,320,728 A | | 6/1994 | Tepman | .................. 204/192.12 |
| 6,024,843 A | | 2/2000 | Anderson et al. | ...... 204/192.12 |

FOREIGN PATENT DOCUMENTS

EP  0 874 065  * 4/1998

* cited by examiner

*Primary Examiner*—Rodney G. McDonald
(74) *Attorney, Agent, or Firm*—Charles S. Guenzer

(57) ABSTRACT

A multi-track magnetron having a convolute shape and asymmetric about the target center about which it rotates. A plasma track is formed as a closed loop between opposed inner and outer magnetic poles, preferably as two or three radially arranged and spirally shaped counter-propagating tracks with respect to the target center and preferably passing over the rotation axis. The pole shape may be optimized to produce a cumulative track length distribution conforming to the function $L=ar^n$. After several iterations of computerized optimization, the pole shape may be tested for sputtering uniformity with different distributions of magnets in the fabricated pole pieces. If the uniformity remains unsatisfactory, the design iteration is repeated with a different n value, different number of tracks, or different pole widths. The optimization reduces azimuthal sidewall asymmetry and improves radial deposition uniformity.

21 Claims, 11 Drawing Sheets

$E = qv$

MULTI-TRACK MAGNETRON EXHIBITING MORE UNIFORM DEPOSITION AND REDUCED ROTATIONAL ASYMMETRY

FIELD OF THE INVENTION

The invention relates generally to sputter deposition of materials. In particular, the invention relates to a magnetron creating a magnetic field to enhance sputtering.

BACKGROUND ART

Sputtering, alternatively called physical vapor deposition (PVD), is commonly used to deposit layers of metals and related materials in the fabrication of semiconductor integrated circuits and is also used for depositing coatings of materials onto other types of panels. DC magnetron sputtering from conductive targets is the most prevalently used form of sputtering in the commercial fabrication of integrated circuits. As schematically illustrated in the cross-sectional view of FIG. 1, one type of a DC magnetron sputtering chamber 10 includes a vacuum chamber 12 arranged generally symmetrically about a central axis 14. A vacuum pump system 16 pumps the vacuum chamber 12 to a very low base pressure in the range of about $10^{-6}$ Torr or even below. However, an argon gas source 18 connected to the vacuum chamber 12 through a mass flow controller 20 supplies argon into the chamber 12 as a sputter working gas. The argon pressure inside the vacuum chamber 12 is typically held in the low milliTorr range for most materials except copper. A pedestal 22 arranged about the central axis 14 holds a wafer or other substrate to be sputter coated. An unillustrated clamp ring or electrostatic chuck may be used to hold the wafer 24 to the pedestal 22, which is usually heated or water cooled to control the wafer temperature. An electrically grounded (or floating) shield 26 protects the chamber walls and the sides of the pedestal 22 from sputter deposition. A target 28 is arranged in opposition to the pedestal 22 and is vacuum sealed to the vacuum chamber 12 through an insulator 30, which allows the target 28 to be electrically biased with respect to the grounded vacuum chamber 12. At least the front surface of the target 28 is composed of a metallic material to be deposited on the wafer 24, for example, aluminum or titanium.

A DC power supply 32 electrically biases the target 28 to a negative voltage of about −600 VDC with respect to the grounded shield 28 to cause the argon to discharge into a plasma such that the positively charged argon ions are energetically attracted to the negatively biased target 28 and sputter atoms from it, some of which fall upon the wafer 24 and deposit a layer of the target material on it. In reactive ion sputtering, a reactive gas such gas nitrogen or oxygen is additionally admitted to the vacuum chamber 12 to cause the deposition of a metal nitride or oxide. In some applications the pedestal 22 is electrically biased, but in other applications the pedestal 22 is left electrically floating.

The plasma density and hence the sputtering rate can be greatly increased by placing a magnetron 40 in back of the target 28. The magnetron 40, which is an important aspect of the present invention, can assume various shapes and forms. It may include permanent magnets 42, 44 of opposed vertical magnetic polarities, which are covered by respective continuous band-shaped magnetic pole pieces 41, 43. The magnets 42, 44 are typically arranged in a ring shape to form an annular region 46 of a high-density plasma (HDP) adjacent the front face of the target 28. The HDP region 46 results from the magnetic field extending horizontally between neighboring magnetic pole pieces 42, 44 and trapping electrons in front of the target 28, thereby increasing the plasma density. The increased plasma density greatly increases the sputtering of the adjacent region of the target 28. The closed ring shape of the HDP region 46 produces a current loop within the plasma, which increases the discharge efficiency since there are no ends of the loop from which the plasma may leak.

To provide a more uniform target sputtering pattern, the ring-shaped magnetron 40 is typically formed asymmetrically about the central axis 14 and a motor 50 drives a rotary shaft 52 extending along the central axis 14. A plate 54 fixed to and rotated by the rotary shaft 52 supports the magnets 42, 44 and pole pieces 41, 43 so that the magnetron 40 rotates about the central axis 14 and produces an azimuthally uniform time-averaged magnetic field. If the magnetic poles 42, 44 are formed by respective rings of opposed cylindrical permanent magnets, the plate 54 is advantageously formed of a magnetic material to serve as a magnetic yoke to magnetically couple the opposed magnets 42, 44.

Magnetrons of several different designs have been applied to the sputter chamber of FIG. 1. Tepman describes in U.S. Pat. No. 5,320,728 a magnetron that has a flattened kidney shape. For example, as illustrated in the plan view of FIG. 2, a kidney-shaped magnetron 60 includes an outer pole 62 of one magnetic polarity surrounding an inner pole 64 of the other magnetic polarity. A gap 66 of nearly constant width separates the two poles 62, 64 and has a flattened kidney shape. The gap 66 defines an annular band in which the magnetic field between the two poles 62, 64 is approximately horizontal with the sputtering face of the target 28. The kidney-shaped magnetron 60 is relatively large compared to the target 28, having a periphery encompassing a substantial fraction of the area of the target 28. The rotation center 14 of the magnetron 60 falls on or near the inner portion of the inner pole 64. Parker illustrates several variations of the kidney-shaped magnetron in U.S. Pat. No. 5,242,566.

Anderson et al. in U.S. Pat. Nos. 4,995,958 and 6,024,843 describe a cardioid (that is, heart-shaped) magnetron 70 illustrated in plan view in FIG. 3 in which a gap 72 between the two opposed poles forms a symmetric cardioid shape. Anderson et al. have developed a differential equation based upon a constant width for the gap 72. The differential equation for a constant erosion profile has a normalized solution of $$\theta = \sqrt{r^2-1} - arctan\sqrt{r^2-1},$$

where $r=R/R_0$, $R_0$ is the minimum radius of the plasma track, and R and θ are the polar coordinates of the track. This solution, which is based on several approximations, has several problems. The symmetric cardioid shape has two singular and non-differentiable points 74, 76. The outer singular point 74 can be smoothed out with little effect. The inner singular point 76, however, is not so easily smoothed without incurring substantial effects on the erosion uniformity. Furthermore, the exact solution does not extend any closer to the target center 14 than the inner singular point 76 so that, at least in this approximation, the central area of the target 28 is not scanned or sputtered. Anderson et al. also propose a non-symmetric cardioid shape having some resemblance to a kidney shape. However, Anderson et al. join the ends of two cardioid curves with apparently arbitrary curves of uncertain effect on the erosion profile.

There are two additional problems with the theoretical cardioid shape. It is derived for a constant horizontal magnetic field over the width w of the gap 72. This approximation is fairly accurate for the magnets of Anderson et al., which, as illustrated in the schematic cross-sectional view of FIG. 4, are bar magnets 80 horizontally oriented at the back of the target 28 between magnetic keepers 82, 84, acting as pole faces, to produce a dipole magnetic field 86. As illustrated, the dipole magnetic field 86 has a substantially horizontal orientation over the width w between the pole faces on the front side of the target. However, for a number of reasons, more recent magnetrons have tended to be formed, as illustrated in the schematic cross-sectional view of FIG. 5, from cylindrical magnets 87, 88 of opposed vertical magnetic polarities. Continuous band-shaped pole pieces 90, 92 define annular poles adjacent the target 28. A magnetic back plate 94 supports the magnets 87, 88 and further acts as a magnetic yoke. The structure produces a magnetic field that can be described as a sharpened quadrupole field 96 that is more sharply peaked in the front side of the target 28. As a result, the plasma density is greatest near the centerline of the gap and is not really constant over the width of the gap. The centerline is defined as the mid-point of the gap between the opposed magnetic pole pieces 90, 92. A further problem is that the cardioid shape is based upon a constant erosion profile. While target utilization is important and is maximized by a constant erosion profile, often uniform deposition thickness on the wafer is more important, perhaps at the sacrifice of uniform target erosion. Various attempts have been made to modify the cardioid magnetron for more uniform deposition thickness. However, these techniques are felt to be unsatisfactory and to not allow sufficient flexibility in the design and operation of the magnetron.

The previously described magnetrons have been observed to produce a further deleterious effect of azimuthal sidewall asymmetry. Sidewall asymmetry occurs when one sidewall of a hole is sputter coated with more material than an opposed sidewall. Sidewall asymmetry can cause a number of problems, one of which is the drift of alignment indicia used to align the lithography of one level of the integrated circuit with another. Typical alignment indicia are a series of four trenches arranged in a box shape which are etched into the layer to be sputter coated. The width of the trenches is chosen so that the sputter deposition does not planarize the trench alignment marks. As a result, a surface feature is apparent after sputter deposition that is aligned with the underlying indicia and can be used to align the next level of lithography. For example, the inter-level alignment of a developed photoresist structure is checked with the underlying alignment indicia. The photoresist target may be a square hole that should be centered within the box of the alignment indicia if the photomask is correctly aligned with the alignment indicia. If the alignment is out of specification, the resist is stripped and the photoresist process is repeated. However, it has been found that the alignment indicia shift in both radial and azimuthal directions after a thick aluminum layer is deposited using a standard magnetron. Such shifts would arise if the sputter deposition is not symmetric on opposed sidewalls of the trenches. The asymmetries seem to depend on radial location, the target-to-wafer spacing, and sputter target life. Any inter-level misalignment arising from shifting alignment indicia cannot be detected in the post-exposure check since the photomask was aligned to the shifted indicia.

Radial sidewall asymmetry has long been known and is believed to arise from geometric factors of the magnetron shape and the sputtering pattern. It has been common practice to adjust the mask alignment to compensate for the radial sidewall asymmetry because it is relatively well behaved. Azimuthal sidewall asymmetry presents a more difficult problem. Because the magnetron is being rotated along the entire azimuth to supposedly provide azimuthal uniformity, geometrical factors alone are inadequate to explain the azimuthal asymmetry. The azimuthal asymmetry, particularly at the wafer edge, may be greater than the radial asymmetry. Furthermore, the alignment mark shifts arising from azimuthally asymmetric deposition are very difficult to compensate since they vary over the life time of the target.

Another type of magnetron gaining favor with the larger targets for 300 mm wafers is a spirally arranged 5-track magnetron 100 illustrated in plan view in FIG. 6. It includes a multi-wrapped outer pole 102 of one magnetic polarity which surrounds an inner pole 104 of the opposite polarity. The poles 102, 104 are typically defined by magnetic pole pieces in the illustrated shapes. Cylindrical magnets of opposed polarity underlie the two pole pieces at locations indicated by circular holes 108. A typically constant gap 106 separates the two poles and defines a region of high-density plasma adjacent the front face of the target. The gap 106 is arranged in the form of a spiral loop so that a closed drift current loop is set up in the plasma, an efficient method of maintaining a plasma. In the illustrated embodiment, the center 14 of rotation is placed at the inner end of the inner pole 104. The size of the magnetron 100 is nearly that of the useful area of the target. The magnetron 100 is referred to a 5-track because any path beginning at the target center 14 and proceeding outwardly at any angle within an arc of greater than 180° crosses five tracks of the current loop. As a result, a high density plasma extends over a large portion of the target face despite the magnet poles 102, 104 being separated by a relatively small gap.

The 5-track magnetron 100 however suffers some disadvantages. Relatively small but still significant azimuthally extending erosion grooves still develop in the target. Also, it is desired to operate the sputter chamber at relatively low pressures. It has been found that the minimum chamber pressure to maintain a plasma adjacent a 5-track magnetron is relatively high due to the long plasma track.

SUMMARY OF THE INVENTION

The invention includes a multi-track magnetron and its use in a plasma sputter chamber in which the magnetron is rotated about the target center.

One aspect of the invention includes a magnetron having inner magnetic pole of convolute shape and a surrounding outer magnetic pole of the opposite magnetic polarity with a nearly constant gap therebetween forming a plasma track in the form of a closed loop in front of the target. The plasma track forms a multi-track with respect to the plasma center of preferably between two and four tracks, preferably two or three tracks, as measured by the number of intersections of by the radii emanating over at least 180° from the target center.

The plasma track preferably passes over the target center. The plasma track preferably is asymmetrically formed with respect to the target center.

The magnetron may be optimized in large part by simulation by adjusting the shapes of the poles such that the centerline of the track more closely follows a cumulative track length distribution from the target center of $L=ar^n$, where n may be varied. A value of $n=2$ corresponds to uniform target erosion. A larger value corresponds to heavier edge erosion and a lesser value corresponds to heavier center erosion. The track centerline is the midpoint between the two opposed magnetic poles.

The design may start with an initial asymmetric shape having a given number of tracks with the track passing over the target center. Thereafter, the track length distribution L is determined from the given shape of the magnet centerline. The shape is then adjusted in a design iteration mostly involving computer optimization to more closely conform with the desired $L=Ar^n$. This optimization is principally directed to radial deposition uniformity.

After the reshaping has produced good calculational results, pole pieces are fabricated with space for excess number of magnet positions. The poles are filled with a distribution of magnets, and the resulting magnetron is tested for its deposition uniformity or other sputtering characteristic. If the experimental results are unsatisfactory, particularly for radial deposition uniformity, the distribution of magnets is adjusted and the sputtering test is repeated until adequate sputtering performance is achieved or until it is determined that after a number of tests with different magnet distributions that adequate sputtering performance cannot be achieved. In the latter case or if the observed azimuthual asymmetry is unsatisfactory, a major change is made in the magnetron shape, such a new value of n is chosen which would result in shifting the deposition in the desired direction, changing the width of the pole, or changing the number of tracks. The design iteration is then repeated with the new value of n or other major shape change.

The optimization may be divided into a fine shape adjustment primarily affecting the radial erosion symmetry and performed on a computer and a course shape change affecting the azimuthal sidewall asymmetry as well as other features. The fine shape adjustment may focus on the local orientations of the plasma tracks and the course shape adjustment may include changing the radial dependence by changing n, by changing the number of plasma tracks, or changing the total widths of the poles.

The design optimization may be based in part upon reduction of azimuthal asymmetry of deposition into alignment mark trenches producing shifts in the marks. Such shifts have been observed to be reduced by the stated design algorithm. The optimization also improves the radial erosion uniformity and deposition uniformity.

Preferably the poles are shaped as bands of approximately equal width. As a result, the inner pole may have non-magnetic internal cavities and the outer pole may have deep recesses on its exterior.

DETAILED DESCRIPTION OF THE PREFERRED EMBODIMENTS

The invention provides an efficient magnetron shape achieving uniform deposition at low chamber pressure and further provides a design methodology to optimize that shape, a large part of which is easily implemented with modern computer aided design. The flexible design overcomes many of the problems of the magnetrons of the prior art mentioned above.

Figure 7:
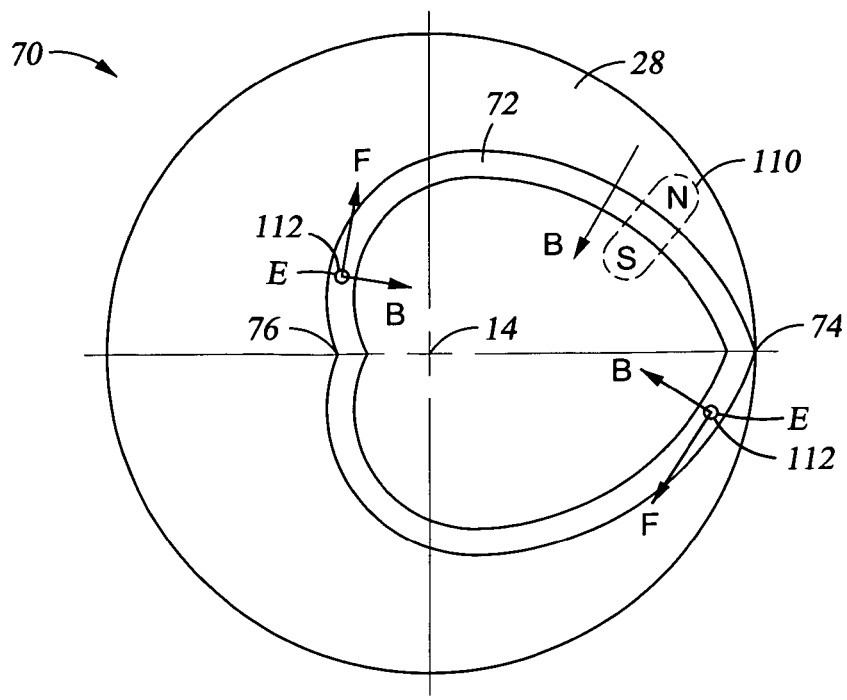
FIG. 7 is schematic plan view useful in explaining the Lorentz shift produced in the cardioid magnetron of FIG. 3.
Figure 8:
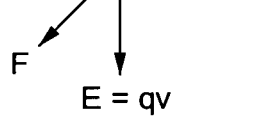
FIG. 8 is a simple illustration of the different directions involved in the Lorentz force.

It is believed that the azimuthal sidewall asymmetry arises from the Lorentz force. As schematically illustrated in FIG. 7 for the cardioid magnetron 70, a centerline of the gap 72 defines a plasma loop dominating the sputtering of the target. The plasma loop is set up by an annular array of magnets, one magnet pair 110 being shown, creating a magnetic field B extending perpendicularly across the loop. The direction of the magnetic field B is illustrated at two opposed sides of the loop. An argon sputtering ion incident on the target is subject to an electric field E perpendicular to the target as it traverses the relatively narrow depletion zone or sheath of the plasma adjacent the target, which greatly accelerates the ion to a velocity v that is parallel to E. As a result, the ion is subject to a Lorentz force $$\vec{F} = \vec{E} \times \vec{B} = q\vec{v} \times \vec{B},$$

where q is the electric charge on the argon ion, v is the velocity of the charged particle (which is principally perpendicular to the wafer as the ion is accelerated across the plasma sheath), and B is the magnetic field flux density, the last two terms being represented in vector form in the equation. The argon ion is sufficiently accelerated by the electric field to have enough energy to sputter atoms from the target 28. Modem magnetrons produce a relatively high magnetic field, particularly near the centerline of the plasma loop, and the Lorentz effect increases with magnetic field. The Lorentz force F is perpendicular to both E and B, as illustrated in the orthographic view of FIG. 8, and generally follows the local tangent of the track of the plasma loop to accelerate the argon ion along the direction of the Lorentz force. That is, the acceleration follows the centerline of the entire plasma loop. The Lorentz force causes the energetic argon ions to strike the target at an inclined angle, which has been estimated to be between 50° and 20° off normal.

Because of the inclined argon trajectories, the emission profile of the sputtered atoms is similarly inclined in the opposite direction in a direction generally following the plasma loop, thereby causing an azimuthal asymmetry in sputtering pattern at any given point of magnetron rotation.

Even though the two illustrated points 112 on the plasma loop following the closed gap 72 produce complementary asymmetries, the two points are too far apart in radius to cancel each other. At most radial positions on the wafer, the sputter deposition is dominated by only one of the points 112.

The dependence on magnetic field of the Lorentz effect and of the resultant azimuthal asymmetry of the alignment mark may explain why the alignment shifts depend upon target lifetime. As the target erodes during usage, the target surface being sputtered comes closer to the magnetron. As a result, the magnetic field at the current target surface increases with target life and hence the Lorentz-induced asymmetry increases.

With this understanding of the Lorentz effect, the azimuthal sidewall asymmetry can be substantially reduced by assuring that opposed tracks in the plasma loop are relatively close together. For example, as illustrated in the plan view of FIG. 9, an asymmetric 2-track magnetron 120 produces a plasma loop 122 that has a relatively narrow separation between neighbor portions of the loop 122 subject to antiparallel magnetic fields producing compensating Lorentz effects. In particular, neighboring opposed portions 124 of a plasma loop 122 have radii differing by substantially less than the target diameter. The loop 122 is characterized as being asymmetric about the rotational center 14 and across any diameter through the center 14. It is also characterized as being a 2-track loop in the sense that radii drawn from the rotational center 14 in angular directions extending over at least 180° and preferably at least 270° pass through two portions of the plasma loop 120. Because the two portions with opposed Lorentz force are relatively close and tend to compensate each other, the azimuthal sidewall asymmetry is substantially reduced or even eliminated.

Figure 9:
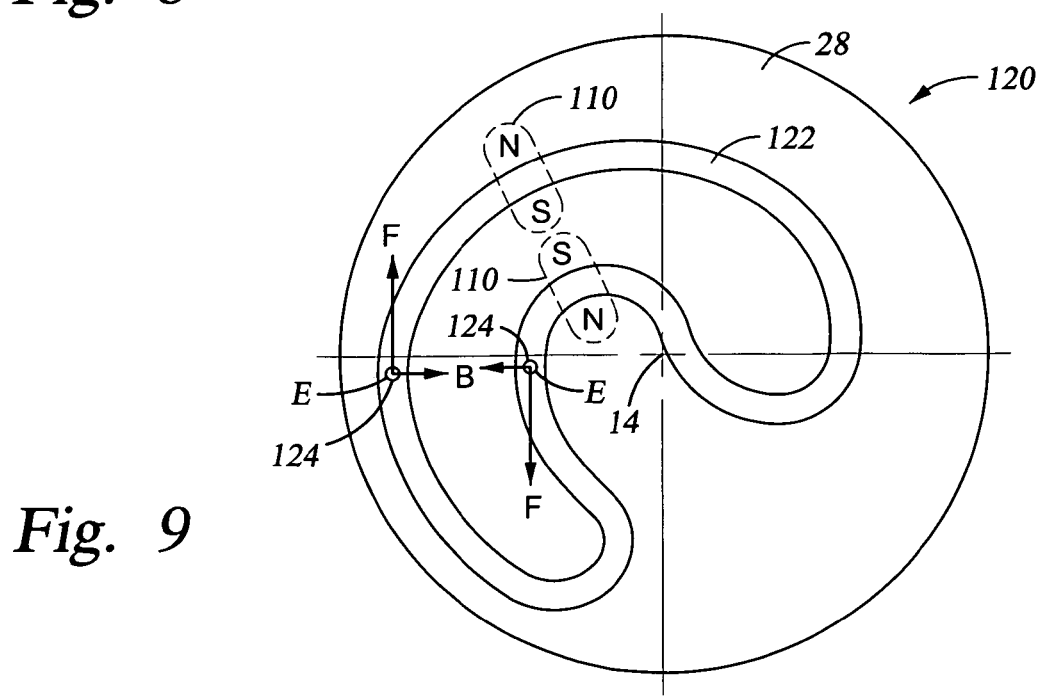
FIG. 9 is a plan view of one embodiment of the invention including an asymmetric 2-track magnetron.
Figure 10:
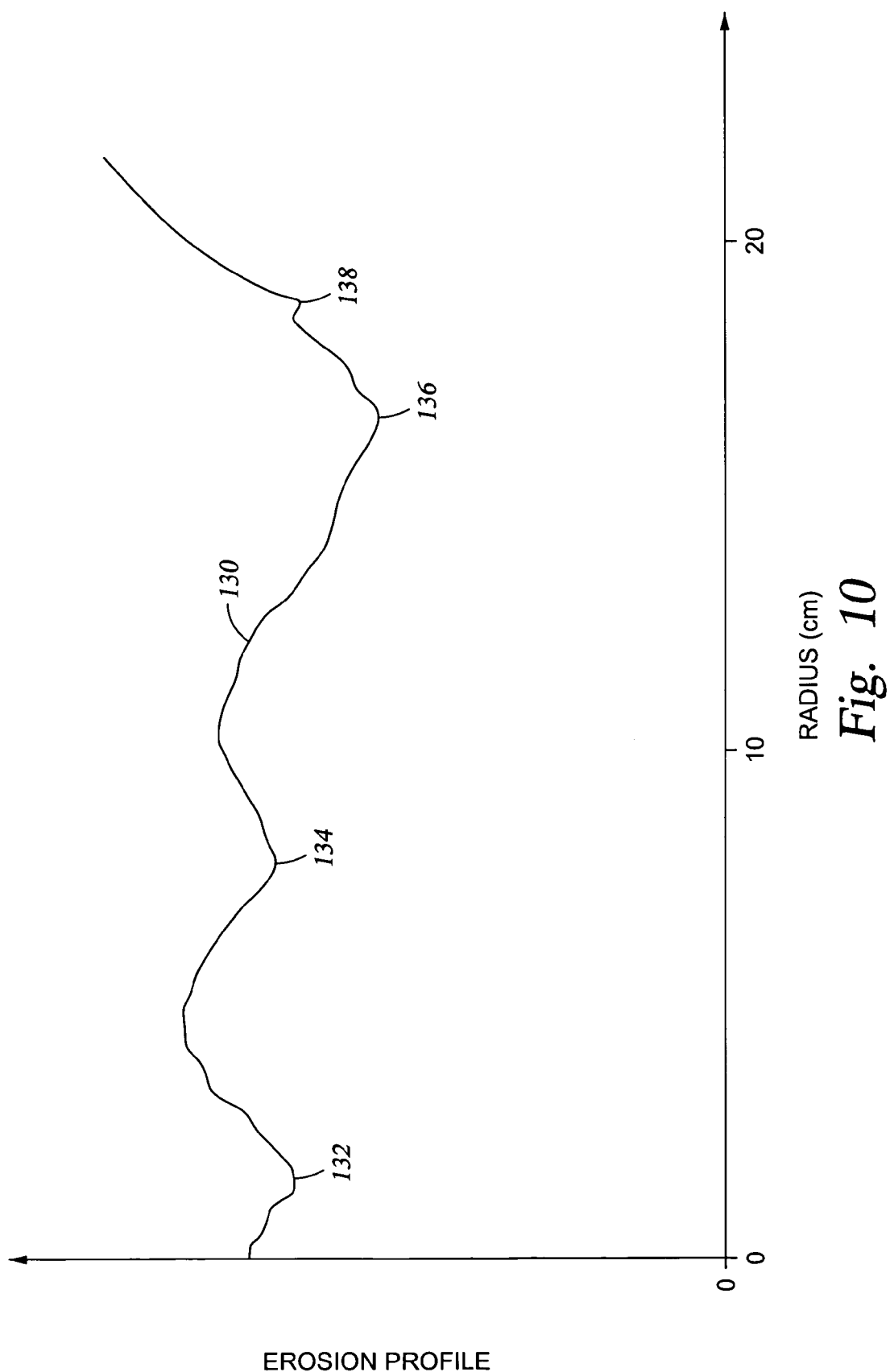
FIG. 10 is a graph illustrating the peaks in a target erosion profile.

However, erosion asymmetry needs to be addressed as well. In the typical embodiment, the magnetron is rotated about the target center 14 so that azimuthal erosion uniformity is largely achieved. Radial erosion uniformity is a different matter. When a two-track magnetron of the general shape of that of FIG. 9 is rotationally scanned during extended periods of target sputtering, the target develops an erosion profile 130 illustrated in FIG. 10 as a function of radius from the target center. The overall erosion uniformity is considered to be relatively good, but four distinct grooves 132, 134, 136, 138 are observed to develop in regions of heavy target erosion. The third groove 136 is observed to have a width bracketing the wafer radius. However, it is desired to more closely control the radial erosion and in some applications cases to significantly improve the radial uniformity. We believe that the asymmetry of the plasma loop 122 of the magnetron can be tailored to produce substantially uniform deposition.

Figure 1:
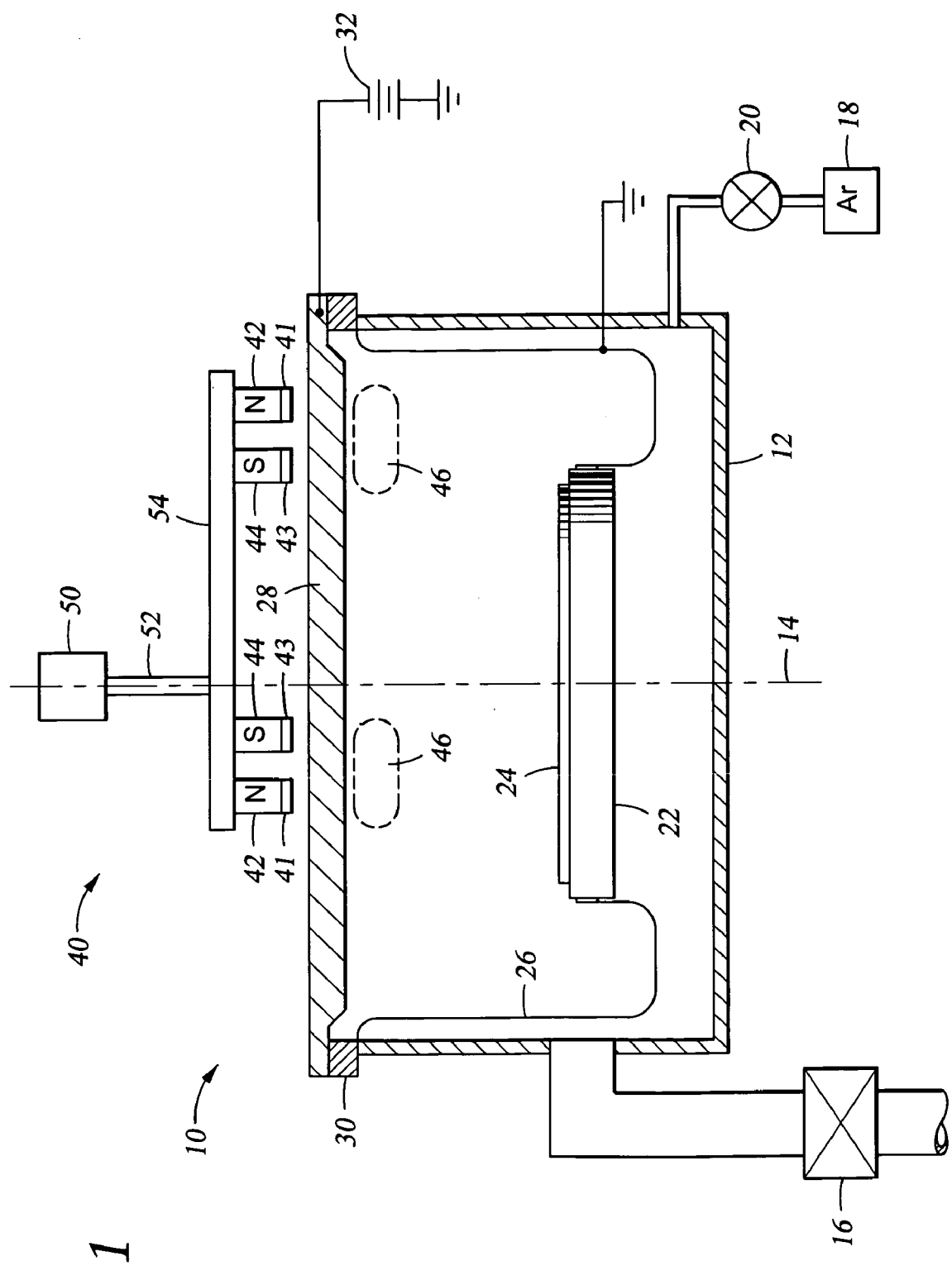
FIG. 1 is a schematic cross-sectional view of a plasma sputter chamber which may incorporate the invention.
Figure 2:
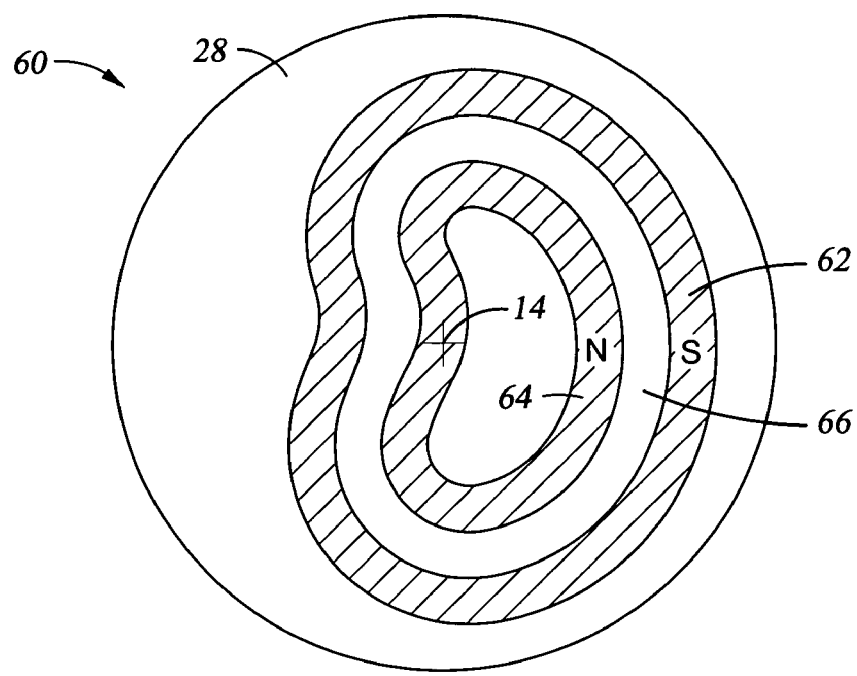
FIG. 2 is a plan view of a kidney-shaped magnetron of the prior art.
Figure 3:
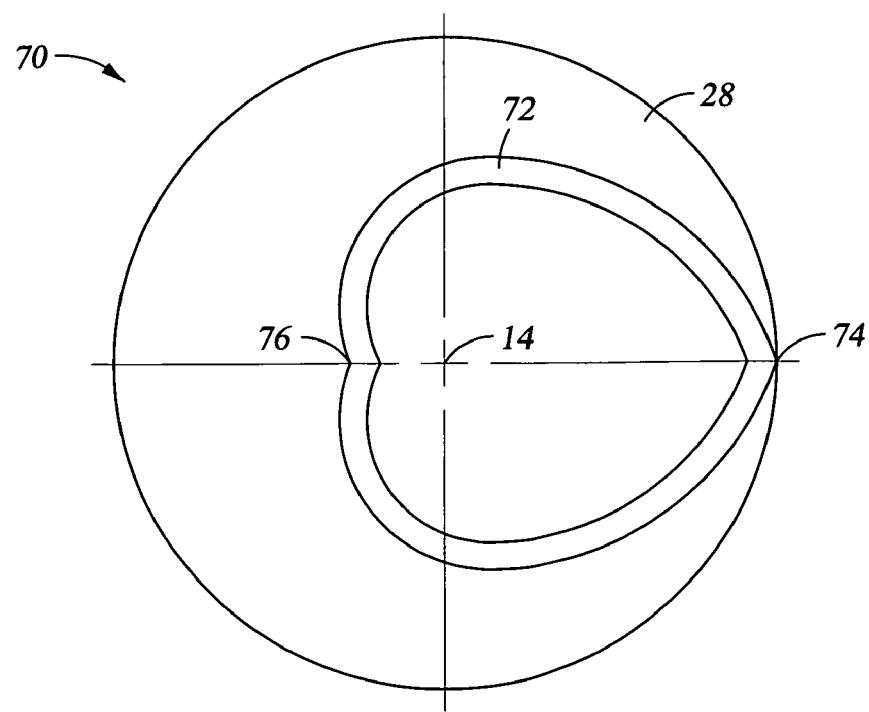
FIG. 3 is a plan view of a cardioid magnetron of the prior art.
Figure 4:
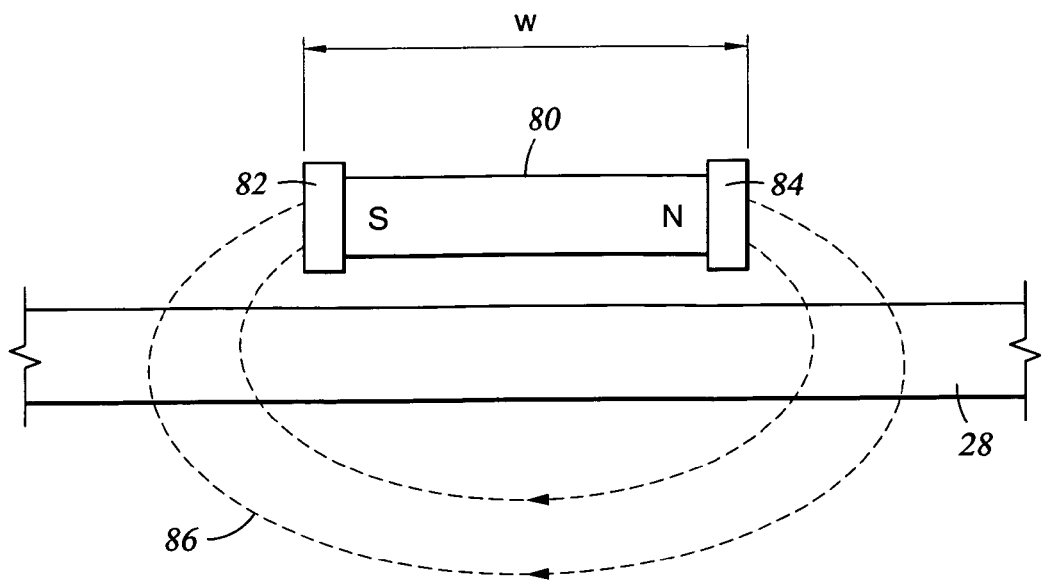
FIG. 4 is a side view of the magnetic field produced by a horizontally oriented permanent magnet of the prior art.
Figure 5:
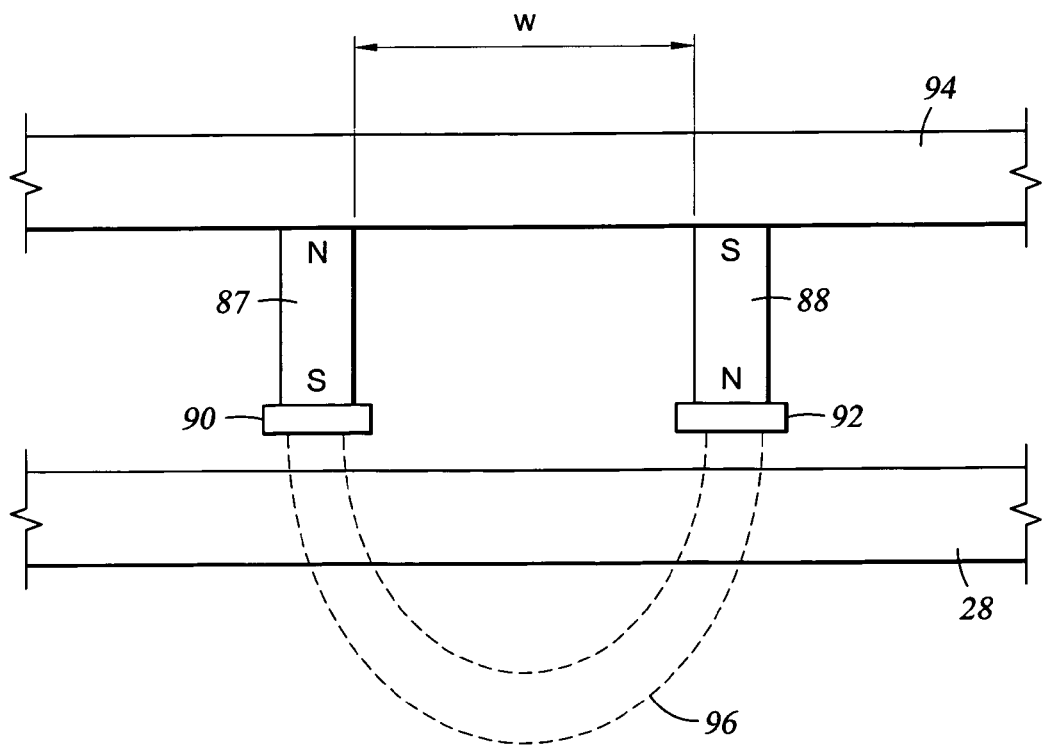
FIG. 5 is a side view of the magnetic field produced by two opposed vertically oriented permanent magnets of the prior art.
Figure 6:
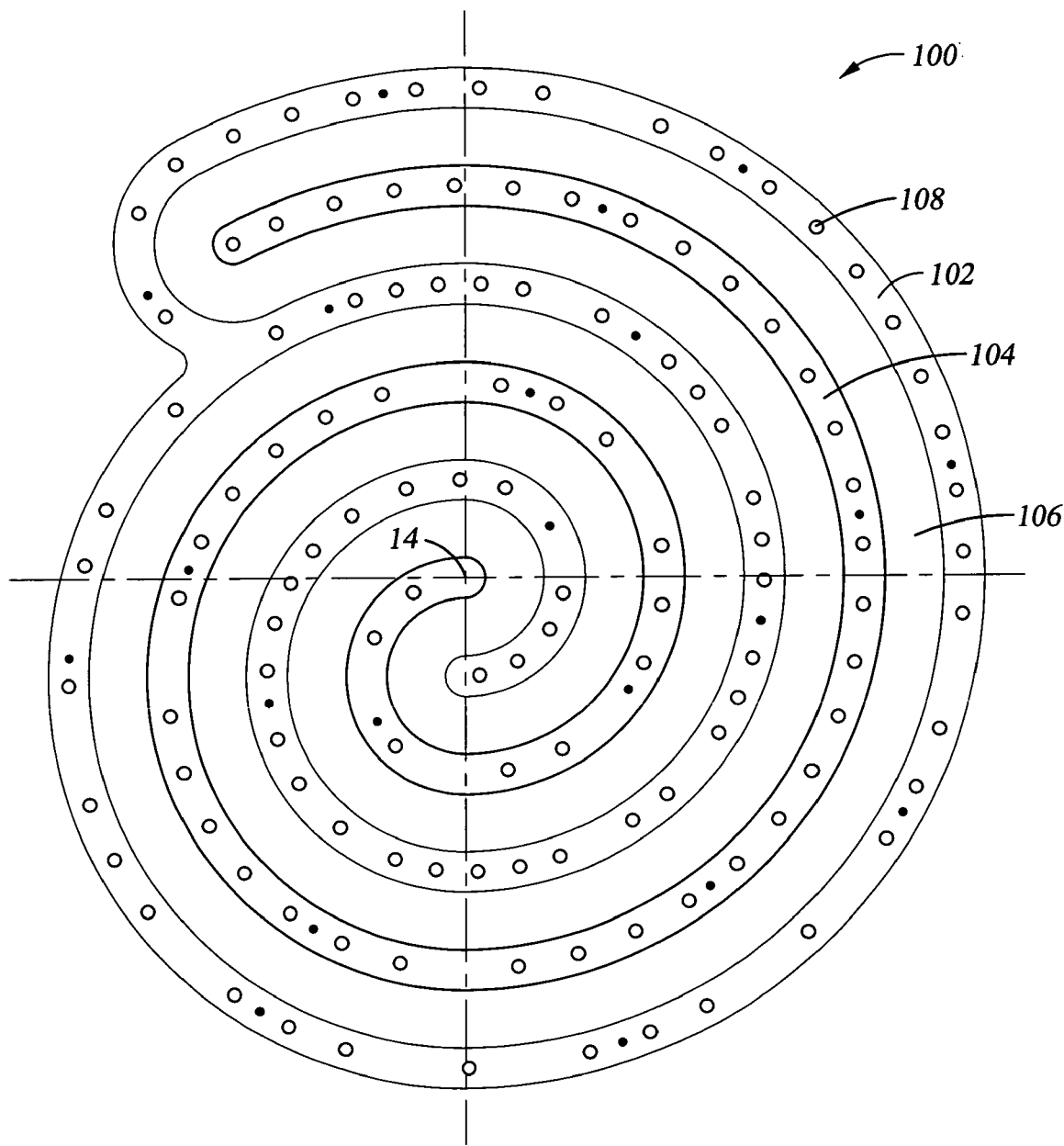
FIG. 6 is a plan view of a 5-track magnetron of the prior art, which is more symmetric than exemplary magnetrons of the invention.

The 5-track magnetron 100 of FIG. 6 provides relatively good compensation of the Lorentz effect, but it still suffers from less than ideal target erosion uniformity and requires too high a chamber pressure to strike and sustain the plasma. We believe that the pressure problem is partially caused by an excessive length in the plasma loop and the narrow gap between the opposed magnetic poles. This problem may be substantially reduced by reducing the number of tracks to two or three. On the other hand, we believe that the non-uniform target erosion is caused by the high azimuthal symmetry, that is, large portions of the loop extending along approximately the same radius. Uniformity can be greatly improved even in a 2-track magnetron by reducing the symmetry. On the other hand, many benefits of the invention can be enjoyed by a 4-track or 5-track magnetron.

Figure 11:
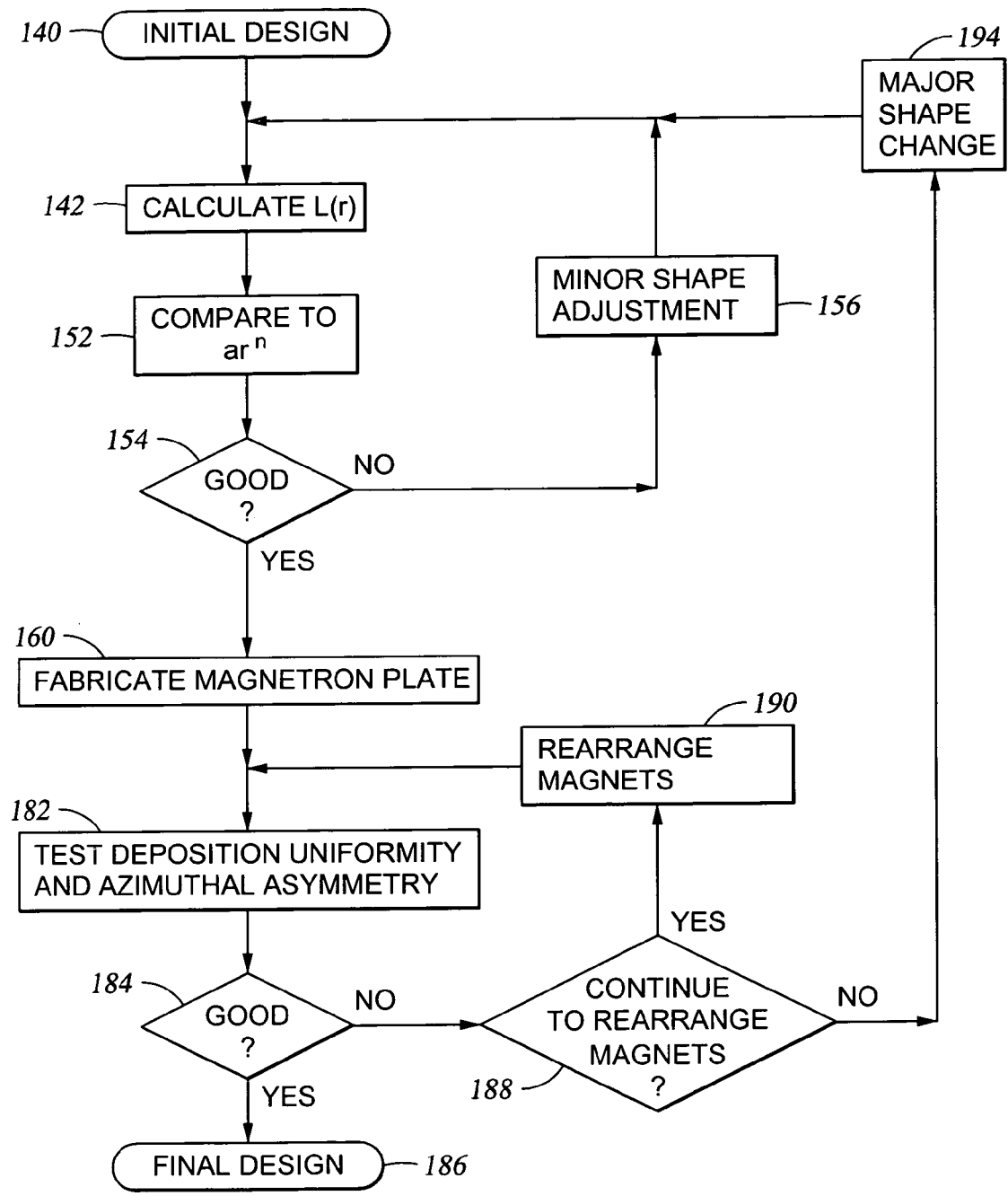
FIG. 11 is a process flow diagram of a method of optimizing the shape of a multi-track magnetron.
Figure 12:
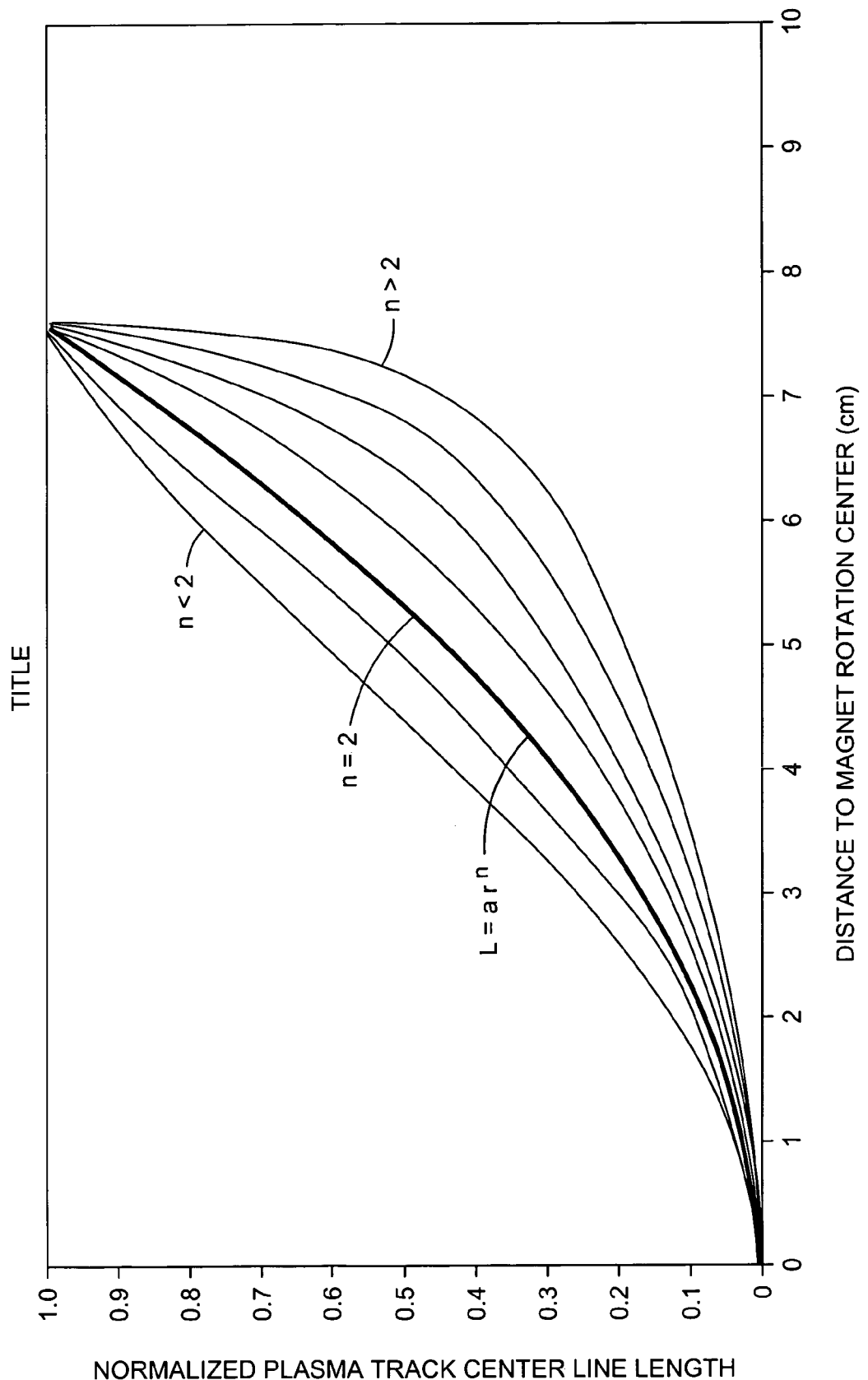
FIG. 12 is a graph of the cumulative track distribution for different parameters of a theoretical relationship.

The precise shape of the magnetron may be easily designed in an iterative process illustrated in the flow diagram of FIG. 11 following a few criteria. The design process is eased for manual adjustment by relying upon a design principle of $$L = ar^n,$$

where a is a constant, r is the distance of a point on the plasma loop centerline from the target center, n is a constant in the neighborhood of 2, and L is the total length of the plasma loop centerline within a radius r, as in FIG. 9. The calculations are performed by segmenting the shape and constructing a distribution between L and r. Both of the two portions of the track emanating in opposite directions from the center are included in this distribution. It is generally preferred that the plasma loop pass over the target center. The function is plotted in the graph of FIG. 12 for various values of n. A value of n=2 generally corresponds to uniform target erosion. A value of n>2 corresponds to greater erosion at the target edge, which is often desired for smaller targets relative to the size of the wafer or for larger spacing between the target and wafer relative to target size. A large target may be beneficial but requires increased cost for equipment and targets. A value of n<2 corresponds to greater erosion at the target center. If the path length is normalized to unity at its longest length $L_M$ within the maximum radius $r_M$, the design principle is plotted in the graph of FIG. 12 for several values of n. The relationship $$L_M = a r_M^n$$

provides a value for a. Note also that $$\frac{L}{L_M} = \left(\frac{r}{r_M}\right)^n.$$

The curves towards the lower right corner produce increasing heavy edge erosion. Note also that the derivative $$\frac{dL}{dr} = nar^{n-1}$$

corresponds to the local length of the plasma track in the neighborhood of r. When n=2, the above derivative is equal to 2ar, which means that the plasma track length within a unit radial increment is proportional to radius, the basis for Anderson's differential equation producing the cardioid shape.

Figure 13:
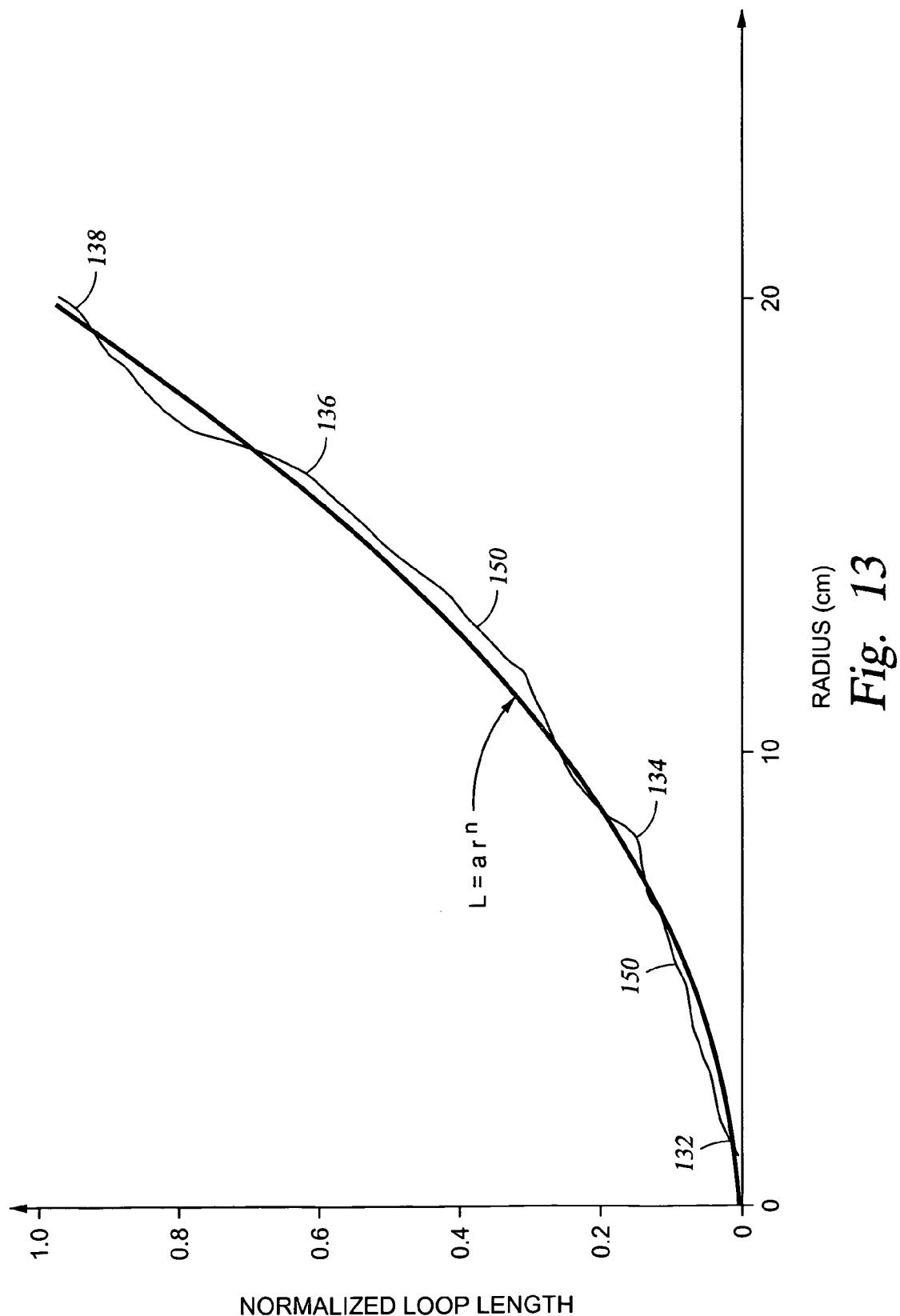
FIG. 13 is a graph illustrating the correlation of the peaks of FIG. 10 with the cumulative track distribution of FIG. 12.

The design process of FIG. 11 begins with a choice of a value for n and an initial design 140 of the magnetron shape and associated path length. For a two-track magnetron, the initial design may be something close to the shape of the magnetron 120 shown in FIG. 9. The shape is segmented and a calculation 142 is made of this shape to determine the radial distribution of the path length L(r). Plot 150 in the graph of FIG. 13 shows the calculation of the plasma track length L for the magnetron 120 of FIG. 9 as a function of target radius, that is, the same variables used in FIG. 12. In step 152 of the process of FIG. 11, the calculated radial distribution L(r) is compared to the corresponding theoretical curve $L = ar^n$ of FIG. 13 for the current value of n. The plot 150 does not exhibit the smooth variation of the theoretical curve. Also shown in FIG. 13 are the radial locations of the experimentally measured erosion grooves 132, 134, 136, 138 of FIG. 10. At least the two grooves 134, 136 correspond to regions of the plot 150 in which the plasma loop length increases are not matched by average increases in the target radius. That is, excessive lengths of the plasma loop exist at these radii, and excessive lengths are expected to cause excessive erosion at these radii.

In step 154 of FIG. 11, it is determined if the design is sufficiently close to the desired curve $L=ar^n$. If it is not, the shape of the magnetron is adjusted in step 156 to change the plasma track path so that the calculated values of plasma loop length vary more smoothly with target radius in closer conformity to the theoretical curve of FIG. 12 for the desired value of n. The shape adjustment of this step 156 is considered a minor adjustment since the overall shape of the magnetron remains much the same and the changes are made on a local basis primarily by slightly moving or reorienting the plasma track. The shape adjustments of step 156 are primarily directed to the radial deposition uniformity.

It is conceivable that the shape adjustment be performed according to a computerized algorithm. However, at the present time a manual adjustment is satisfactory and easily implemented in combination with a visualization program and in view of some general techniques. Since the calculation and comparison can be performed quickly on a computer, after each small change, it may be determined if that change produces a positive or negative result to determine if it should be retained, reduced, or increased. A few of the optimization techniques will now be described.

Figure 14:
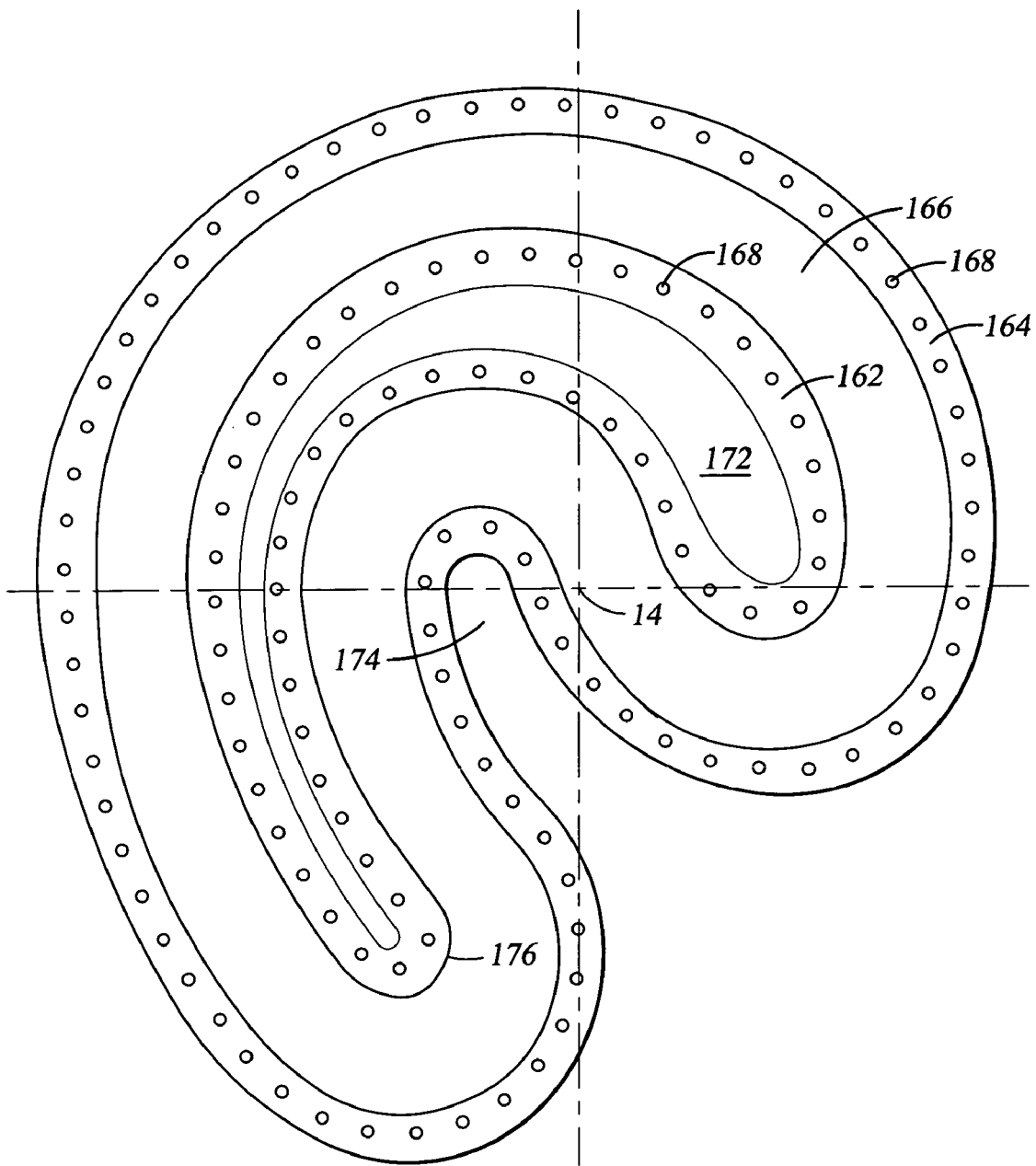
FIG. 14 is a plan view of an optimized 2-track magnetron.

If the integrated loop length increases excessively near the center 14, the excessive increase may arise from the plasma loop near the center being symmetrical on two sides of the center 14. This effect can be reduced, as illustrated in FIG. 14, by moving the plasma loop to be more asymmetrically arranged about the center 14.

If the integrated loop length increases too quickly at any one radius, the existing loop pattern can be stretched or twisted to bring the local pattern closer to a local radius of the magnetron, that is, passing through the local radius more quickly. On the other hand, if the integrated loop length increases too slowly at any one radius, the pattern can be stretched or twisted to bring the local pattern closer to a local azimuth of the magnetron.

For a multi-track magnetron, the different tracks at the same radius can be adjusted at the same time to produce the desired change in the path length distribution.

After the magnetron shape has been readjusted in step 156 of FIG. 11, the process is iterated by again calculating L(r) in step 142, comparing L(r) to the $ar^n$ curve in step 152, and deciding in step 154 if the comparison is adequate. If it is not adequate, the shape is again readjusted in step 156. Because the iteration loop is mostly performed on a computer with some decisions and inputs by the magnet designer and no actual metal working, an iteration can be very quickly performed. Accordingly, shape adjustment 156 may include only a single change which can be reversed, de-emphasized, or further emphasized in the following iteration. Of course, if a particular sequence of adjustments seems to be non-productive, the shape adjustment of step 156 may return to the shape of a much earlier iteration.

If the decision is made in step 154 that the shape has been adequately adjusted to conform the calculated track length distribution to the $ar^n$ curve, in step 160, magnetron plates are fabricated accordingly to the optimized design. As illustrated in the plan view of FIG. 14, the magnetron plates include an inner pole piece 162 and an outer pole piece 164, which when assembled to a back yoke forms a convolute plasma track 166 of substantially constant width between them. Each of the pole pieces 162, 164 includes a fairly regular series of holes 168 for capturing cylindrical magnets encapsulated in a canister having two end knobs which fit in the holes 168 and are held there when the pole pieces 162, 164 are bolted to the yoke or other magnetron support structure. In an alternative design, the magnet canisters may have flat ends that fit within larger holes 168 or there may be some other means for locating and fixing cylindrical magnets to the pole pieces 162, 164. Because of the holes 168, it is typically necessary to also fabricate a yoke for each magnetron design. It is, of course, appreciated that machining pole pieces and yokes is a time-consuming and somewhat expensive process, particularly in comparison to the computer-based optimization loop of steps 142, 152, 154, 156 of FIG. 11.

As an ancillary matter, it has been found desirable to form the pole pieces 162, 164 as bands having generally constant widths. In the adjustment process, when a pole piece, particularly the inner pole piece 162, forms an acute end 176, the width of the pole piece near the acute end 176 is preferably maintained at about twice the normal band width although this condition need not be invariably followed. If the shape dictates that the total pole width be greater than twice the normal band width, the interior space 172 and the exterior space 174 are formed by maintaining the normal band width. This approach has been observed to simplify the magnet optimization to be described later.

It is seen that in the illustrated design, over more than 180° and almost 270° of azimuth, radii extending from the rotation center 14 pass through the plasma track 166 two times (over a few degrees, they partially pass three times). The result is a two-track magnetron having a high fraction of radii disposed between portions of the plasma track 166 subject to anti-parallel magnetic fields in the nearly parallel and closely separated inner and outer portions of the track 166, thereby alleviating the Lorentz asymmetry problem.

Returning now to the optimization process of FIG. 11, once the specially fabricated pole pieces and yoke have been returned to the semiconductor development lab and time is found on expensive, commercial-grade sputter chambers, the pole pieces and yoke are incorporated into a magnetron and mounted on the sputter chamber. Initially, a standard distribution of magnets is loaded into the pole pieces. There may be substantially more magnet holes than the total number of magnets intended to be used.

In step 182, deposition uniformity and sidewall asymmetry are tested with the current design of magnetron and magnet distribution. The sputter chamber is operated under standard operating conditions of wafer temperature, chamber pressure, and target power to deposit representative layers of the target material on the wafer. For measurement of sidewall asymmetry, the wafer should be preformed with square-shaped alignment marks having the depths and widths intended for the application.

After one or more of wafers have been so coated, the thickness uniformity and azimuthal sidewall asymmetry are measured. Thickness may be determined by MetaPulse or XRF testers or calculated from electrical measurement of surface resistance at numerous locations about the wafer. Sidewall uniformity typically involves sectioning the wafer and imaging the alignment mark structures by scanning electron microscopy (SEM), a much more time consuming process.

After completion of testing, a decision 184 is made whether the tested radial deposition uniformity and possibly azimuthal sidewall uniformity are adequate or could be further improved. If the uniformity and sidewall asymmetry are considered adequate, the current shapes for the pole pieces and current magnet distribution constitute a final design 186. If the radial distribution and azimuthal sidewall uniformity or other characteristics are found to be inadequate, some further changes are required. A determination is made in a decision step 188 if the radial deposition uniformity or other sputtering performance characteristic can be improved by continuing to rearrange magnets. If so, in step 190, the magnets are rearranged and the chamber testing of step 182 is repeated. However, rearranging magnets has little effect on sidewall asymmetry. Therefore, if the decision 184 determines that the uniformity or other sputtering performance characteristic is grossly inadequate or the magnetron needs major redesign to achieve better azimuthal sidewall uniformity and cannot be improved by magnet rearrangement, the magnetron needs to be redesigned in step 194 for increased compensation effect between neighboring plasma tracks, for example, by longer tracks or more closely spaced tracks. In those cases, the design process returns to step 142.

The rearrangement in step 190 is preferably based on the deposition uniformity results from step 182. Wafer radii are identified having excessively thick depositions. Magnets are removed from the opposed poles pieces on either side of the plasma track of the magnetron at those radii. Excessive edge deposition may be solved by removing magnets from the magnetron disposed outside the wafer diameter. Aluminum sputtering for blanket film deposition typically involves balanced magnetrons so corresponding magnets on the two poles should be removed or added at the same time although this is not a strict requirement. For radii of the wafer having low deposition thickness, magnets are added to the poles on opposite sides of the plasma track at those low-deposition radii of the wafer. If there is insufficient space to add more magnets at the desired positions, alternatively magnets may be removed from other radii. The total number of magnets may be changed in the rearrangement step 190.

The process is then iterated in which the rearranged magnetron is mounted in the sputter chamber and the deposition uniformity is tested. The rearrangement iteration continues until either decision 184 determines that an adequate result has been achieved or decision 188 determines an additional magnet rearrange is unlikely to improve uniformity.

If the decision is made in step 188 to not again rearrange the magnets, the design process returns to the computer. In step 194, a major change is made to the shape of the magnetron poles. The major change may include changing the value of n for the $ar^n$ curve. The decision is typically made by the design engineer monitoring the process, who decides whether the observed deposition non-uniformity is caused by excessive center deposition or by excessive edge deposition. Excessive center deposition is corrected by increasing the value of n while excessive edge deposition, usually not a problem for baseline designs, is corrected by decreasing the value of n. The amount of increase or decrease depends on the skill and experience of the engineer. Alternatively, if the azimuthal sidewall symmetry is insufficient, the major shape change may decrease the widths of the pole pieces to increase the Lorentz compensation between neighboring tracks. A more fundamental change is to change the number of tracks, for example, increasing them from two to three. An increased number of tracks should always improve the azimuthal sidewall asymmetry since the tracks are necessary closer together. However, increasing the number of tracks also lengths the plasma current loop making low-pressure operation more difficult.

With the changed value of n or other major change, the minor shape adjustment loop of steps 142, 152, 154, 156 is reentered and the above process repeated. It should also be noted that slight deviations from the smooth theoretical curves are allowed for correcting localized film non-uniformity.

The design process thereby produces an optimized shape and magnet distribution for two-track magnetron with a reduced amount of sputter chamber time and fabrication delays.

Figure 15:
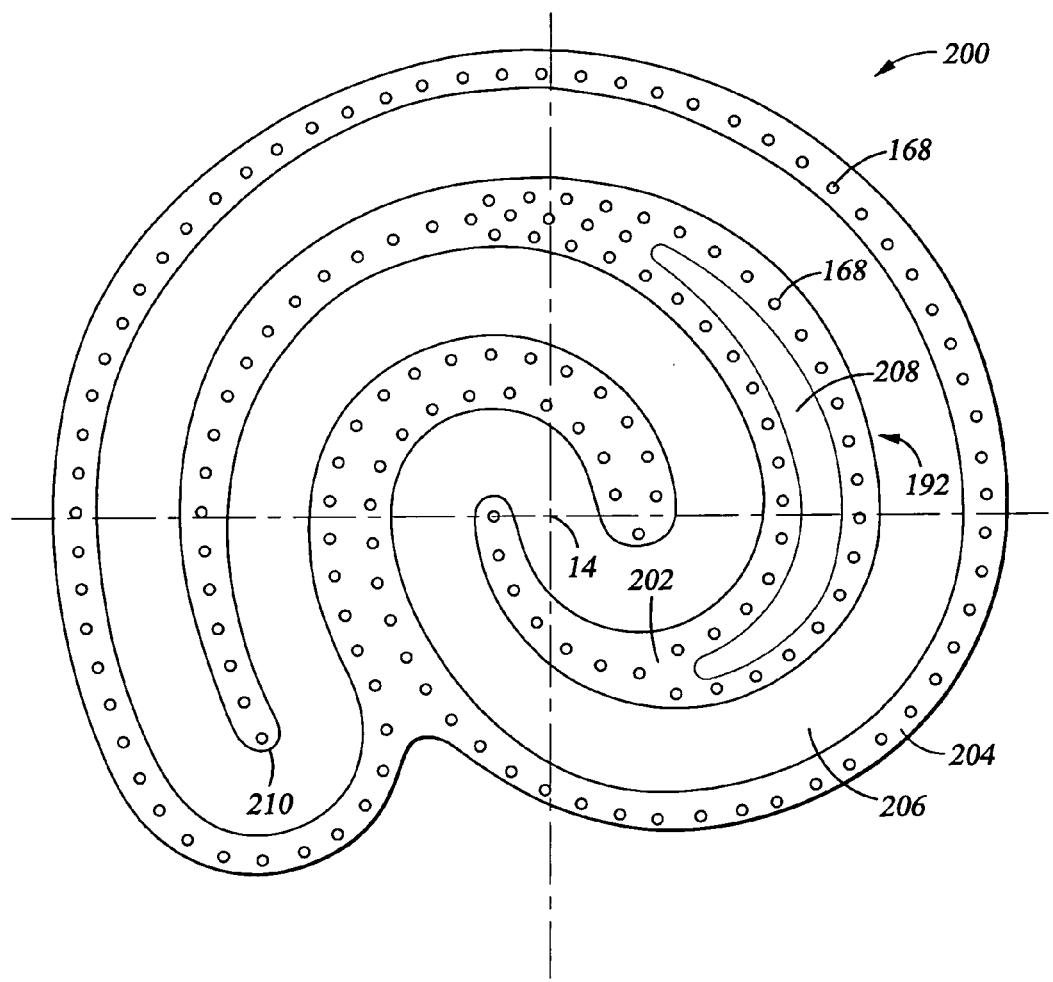
FIG. 15 is a plan view of an optimized 3-track magnetron.

The invention can be applied also to achieve an optimized three-track magnetron 200, starting with an initial 3-track shape, similar to the final design illustrated in the plan view in FIG. 15. The 3-track magnetron 200 has an inner pole piece 202 and an outer pole piece 204 separated by a substantially constant gap 206 defining a plasma track in the sputter chamber and having magnet capturing holes 168 formed therein. Over more than 180° and almost 270° of azimuth, radii from the rotation center 14 pass through at least three portions of the plasma track. Note that in this design the rule regarding a pole pieces formed of uniformly wide bands is mostly observed and produces an aperture in the inner pole piece 202. However, the inner pole piece 202 has two acute ends 210, adjacent to which the combined parallel portions of the inner pole piece 202 has a width of only one band. It further has a fat central portion 192 with an aperture 208. Not all the magnet holes 168 need to be populated in the inner pole piece 202.

The invention thus provides both a magnetron shape providing good low-pressure operation and reasonable deposition uniformity and reduced azimuthal sidewall asymmetry. The invention further provides an optimization technique for improving the deposition uniformity without excess fabrication or testing.

The invention claimed is:

1. A magnetron configured to rotate about a central axis, comprising:
    an outer pole of a first magnetic polarity;
    an inner pole of a second magnetic polarity opposite said first magnetic polarity, formed in a generally spiral shape extending along a length between two ends, disposed inside of said outer pole, and having a width varying along a central portion of said length; and
    a gap of approximately constant width separating said inner and outer poles and passing over said central axis, wherein said poles are arranged such that said gap forms a closed track of asymmetric form with respect to said central axis;
    wherein radii emanating from said central axis over an angular range of at least 180° cross said track at least twice.

2. The magnetron of claim 1, wherein said angular range is at least 270°.

3. The magnetron of claim 1, wherein said radii cross said track at least three times.

4. The magnetron of claim 1, wherein said inner and outer poles are formed in two closed bands of substantially equal width.

5. The magnetron of claim 1, wherein a first non-magnetic aperture is formed in said inner pole but no non-magnetic aperture of size comparable to the first non-magnetic aperture is formed in the outer pole.

6. A magnetron configured to rotate about a central axis, comprising:
    an outer pole of a first magnetic polarity;

an inner pole of a second magnetic polarity opposite said first magnetic polarity, extending along a length between two ends, disposed inside of said outer pole, and having a width varying along a central portion of the length; and a gap of approximately constant width separating said inner and outer poles, wherein said poles are arranged such that said gap forms a closed track passing over said central axis;

wherein radii emanating from said central axis over an angular range of at least 180° cross said track at least twice but less than six times.

7. The magnetron of claim 6, wherein said track has an asymmetric form with respect to said central axis.

8. The magnetron of claim 6, wherein said radii cross said track less than four times.

9. The magnetron of claim 6, wherein said radii cross said track at least three times.

10. A sputter chamber, comprising:

a vacuum chamber body configured to be sealed to target arranged about a central axis;

a rotary drive system including a drive shaft extending along and rotating about said central axis; and a magnetron supported and rotated by said rotary drive system including an outer pole of a first magnetic polarity, an inner pole of a second magnetic polarity opposite said first magnetic polarity, extending along a length between two ends, disposed inside of said outer pole, and having a width varying along middle portions of the length, and a gap of approximately constant width separating said inner and outer poles and passing over the central axis, wherein said poles are arranged such that said gap forms a closed track of asymmetric form with respect to said central axis, wherein radii emanating from said central axis over an angular range of at least 180° cross said track at least twice.

11. The sputter chamber of claim 10, wherein said angular range is at least 27°.

12. The sputter chamber of claim 10, wherein said radii cross said track at least three times.

13. The magnetron sputter chamber of claim 10, wherein said inner and outer poles are formed in two closed bands of substantially equal width.

14. The magnetron sputter chamber of claim 10, wherein a first non-magnetic aperture is formed in said inner pole but no non-magnetic aperture of size comparable to the first non-magnetic aperture is formed in the outer pole.

15. A method of designing a magnetron configured to rotate about a central axis and comprising (a) an outer pole of a first magnetic polarity comprising an outer pole piece, (b) an inner pole of a second magnetic polarity opposite said first magnetic polarity, comprising an inner pole piece and disposed inside of said outer pole, and (c) a gap of approximately constant width separating said inner and outer pole pieces, wherein said pole pieces are arranged such that said gap forms a closed track, said method comprising the steps of:

(a) choosing an initial value of n, wherein n is a constant;

(b) choosing an initial shape of said track;

(c) calculating a cumulative distribution of lengths L of said track from said center;

(d) comparing said cumulative distribution with a function $ar^n$ to produce differences therebetween, where a is a constant and r is a radius of said track from said center;

(e) deciding is said differences are sufficiently small;

(f) if said differences are not sufficiently small, adjusting said shape to reduce said differences, and repeating steps (c) through (f).

16. The method of claim 15, wherein following step (e) if said differences are sufficiently small, performing the steps of:

(g) fabricating said pole pieces conforming to a latest version of said shape;

(h) placing magnets of an initial distribution into a magnetron including said fabricated pole pieces;

(i) in a sputter chamber fitted with said magnetron having said fabricated pole pieces and rotating about said central axis, testing a deposition performance; and (j) if said deposition performance is not satisfactory, determining another distribution to improve said performance and repeating steps (h), (i), and (j).

17. The method of claim 16, further comprising the step (k) of making a major shape change including (1) at least one of($k_1$) determining a new value of n, ($k_2$) changing a width of one of said pole pieces, and ($k_3$) changing a number of tracks of said magnetron from that of said initial shape and (2) then returning to step (b).

18. The method of claim 16, wherein said deposition performance comprises at least one of a deposition uniformity and an azimuthal sidewall asymmetry.

19. A magnetron comprising said pole pieces and said magnets designed according to the method of claim 15.

20. The method of claim 17, wherein the major shape change includes ($k_1$) determining a new value of n.

21. The method of claim 15, wherein the initial shape is asymmetric across any line passing through the central axis.

* * * * *